United States Patent [19]

Pilny

[11] Patent Number: 5,152,702
[45] Date of Patent: Oct. 6, 1992

[54] THROUGH BOARD CONNECTOR HAVING A REMOVABLE SOLDER MASK

[75] Inventor: James C. Pilny, Mentor, Ohio
[73] Assignee: Minnesota Mining Manufacturing Company, St. Paul, Minn.
[21] Appl. No.: 726,340
[22] Filed: Jul. 5, 1991
[51] Int. Cl.⁵ .............................................. H05K 1/02
[52] U.S. Cl. ................................. 439/876; 228/216; 439/857
[58] Field of Search ............... 439/82, 83, 876, 857; 228/180.1, 215, 216; 29/839, 840, 843

[56] References Cited

U.S. PATENT DOCUMENTS

| | | | |
|---|---|---|---|
| 3,524,960 | 8/1970 | Lohff | 200/155 |
| 3,989,331 | 11/1976 | Hanlon | 439/83 |
| 4,037,899 | 7/1977 | Crowell | 439/82 |
| 4,070,077 | 1/1978 | Clark | 439/876 |
| 4,350,856 | 9/1982 | Shiratori et al. | 200/306 |
| 4,373,655 | 2/1983 | McKenzie, Jr. | 228/180 R |
| 4,750,889 | 6/1988 | Ignasiak | 439/83 |
| 4,781,602 | 11/1988 | Cobaugh | 439/82 |

OTHER PUBLICATIONS

IBM Bulletin, Bender; vol. 13; No. 7; p. 2121; Dec. 1970.

Primary Examiner—Neil Abrams
Attorney, Agent, or Firm—Gary L. Griswold; Walter N. Kirn; John C. Barnes

[57] ABSTRACT

A solder mask is useful in the preparation of circuit boards when the boards are to be subsequently stacked and a removable plug supported by the solder tail of the contact initially joined to the board affords facile manufacture of the contacts and solder mask and facile assembly of the boards.

7 Claims, 2 Drawing Sheets

THROUGH BOARD CONNECTOR HAVING A REMOVABLE SOLDER MASK

BACKGROUND OF THE INVENTION

1. Field of the Invention

This invention relates to a new solder mask plug which is used to mask a through hole in a printed circuit board during a wave soldering operation, and in one aspect to an improved contact for use in a board socket.

2. Description of the Prior Art

Prior art patents teach the advantages of utilizing a removable plug in a printed circuit board during a common process known as wave soldering for making permanent interconnections electrically with the printed circuit board. When it is desired to not fill, during the wave soldering operation, all of the holes in the circuit board when wave soldering the other leads or soldered tails of other electrical components to the board, a plug may be inserted in the hole which is later removed to open the hole.

Prior U.S. Pat. No. 4,750,889, assigned to the assignee of this application, discloses a solder mask plug as part of a molded connector body which is located on a printed circuit board. The connector body carries contacts which are placed into the connector body and disposed adjacent the molded plugs. The contact tails and plugs are disposed in the holes of the printed circuit board and are wave soldered into the board. The plugs are later driven out of the connector to allow other contact tails to make connection with the contacts of the connector from the bottom of the board. This is important in board stacking applications where the mating pin comes from the bottom or solder side of the board.

The advantages of this invention over the prior known device is that it eliminates the major problem of intricately molding the connector body and breaking the plug from the molded body. Further, the present invention will permit the overall height of the connector to be reduced.

Present invention is thus believed to afford advantages over the prior known devices for connecting a contact to a printed circuit board and later allowing connection to the printed circuit board from either direction and reduce the height of the connector body.

The product of the present invention will still permit a wave soldering of the contact onto the board together with the other electrical components and allow the subsequent opening of a hole in the printed circuit board by removal of a plug for insertion of a contact tail of an electrical component through the hole to make connection with the board.

A further advantage of the present invention is that the masking plug is protected from breakage during manufacture, shipping or assembly operations as was present with the prior design.

SUMMARY OF THE INVENTION

Present invention provides an improved contact for use with a header on a printed circuit board as used in the through board connector design used with hard disk drive designs of the 2.5 inch and 3.5 inch format. The contact comprises a barrel shaped contact tail, a bridge member and a wiping contact. The contact tail supports a removable plug formed of a material to withstand solder bath temperatures.

This invention also provides a through board connector comprising a molded body of electrically insulating material having a plurality of holes extending between opposite sides thereof and a contact member positioned in each of said holes having a barrel portion extending therethrough and adapted to be inserted in an opening in a printed circuit board. The contact tail of the contact may be wave soldered to the board. The contacts have solder mask means disposed within said barrel. The solder mask means is removed in a secondary operation.

BRIEF DESCRIPTION OF THE DRAWINGS

The presently preferred embodiment of the present invention will be described with reference to the accompanying drawings wherein.

DETAILED DESCRIPTION OF THE PRESENTLY PREFERRED EMBODIMENT

Figure 1:
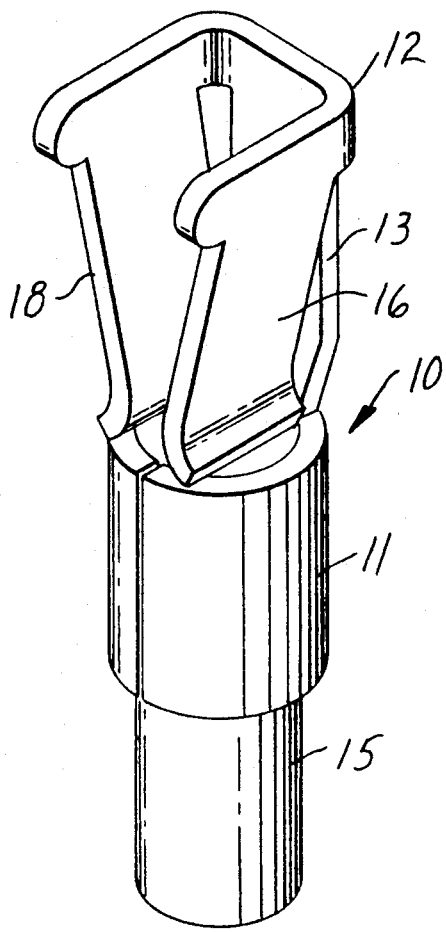
FIG. 1 is a perspective view of a contact according to the present invention with the integral solder mask plug disposed in the barrel thereof.
Figure 2:
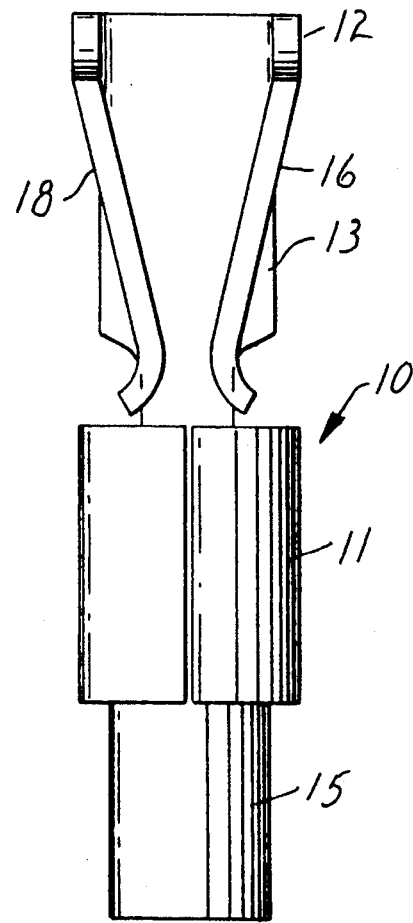
FIG. 2 is a side view of the contact.

Referring now to the drawing, particularly FIG. 1, there is illustrated a contact 10 constructed according to the present invention adapted to fit in a socket for use as a through board connector. The contact 10 includes a contact tail or solder tail 11 and a contacting portion 12. An intermediate or bridge portion 13 joins the contact tail 11 and the contacting portion 12. Contact 10 is formed on a carrier strip from a flat sheet of electrically conductive material utilizing progressive dies which dies form the contact tail 11 into a barrel portion of hollow cylindrical shape. When forming the contact tail 11, the metal is wrapped around a cylindrical plug 15 making substantially 360° peripheral contact therewith to capture the plug 15 in place in the hollow center of the contact tail. Contacting portion 12 of the contact 10 is in the form of a box-type contact With a pair of arms 16 and 18 formed for making wiping contact against a pin contact or the like inserted therebetween for making temporary spring reserve contact with a said pin contact or lead of an electrical component.

The contact 10 is adapted to make connections from either end thereof and from either side of a printed circuit board to facilitate the stacking of printed circuit boards and/or making connections with boards in dense packing of the boards and/or the circuits thereon.

Figure 4:
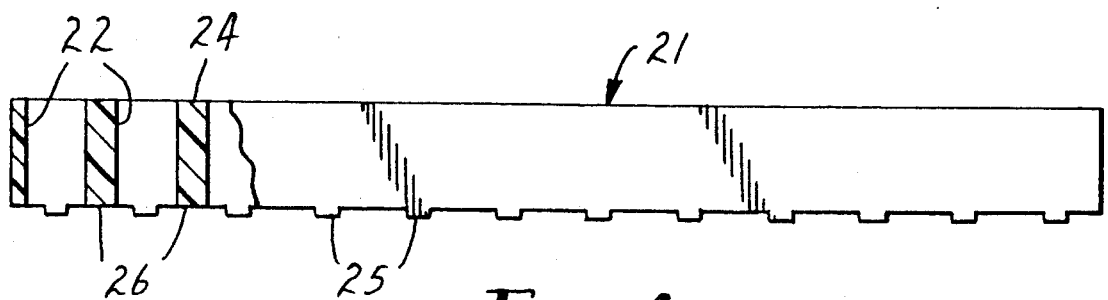
FIG. 4 is a side view partly in section of the body of the through board connector.
Figure 3:
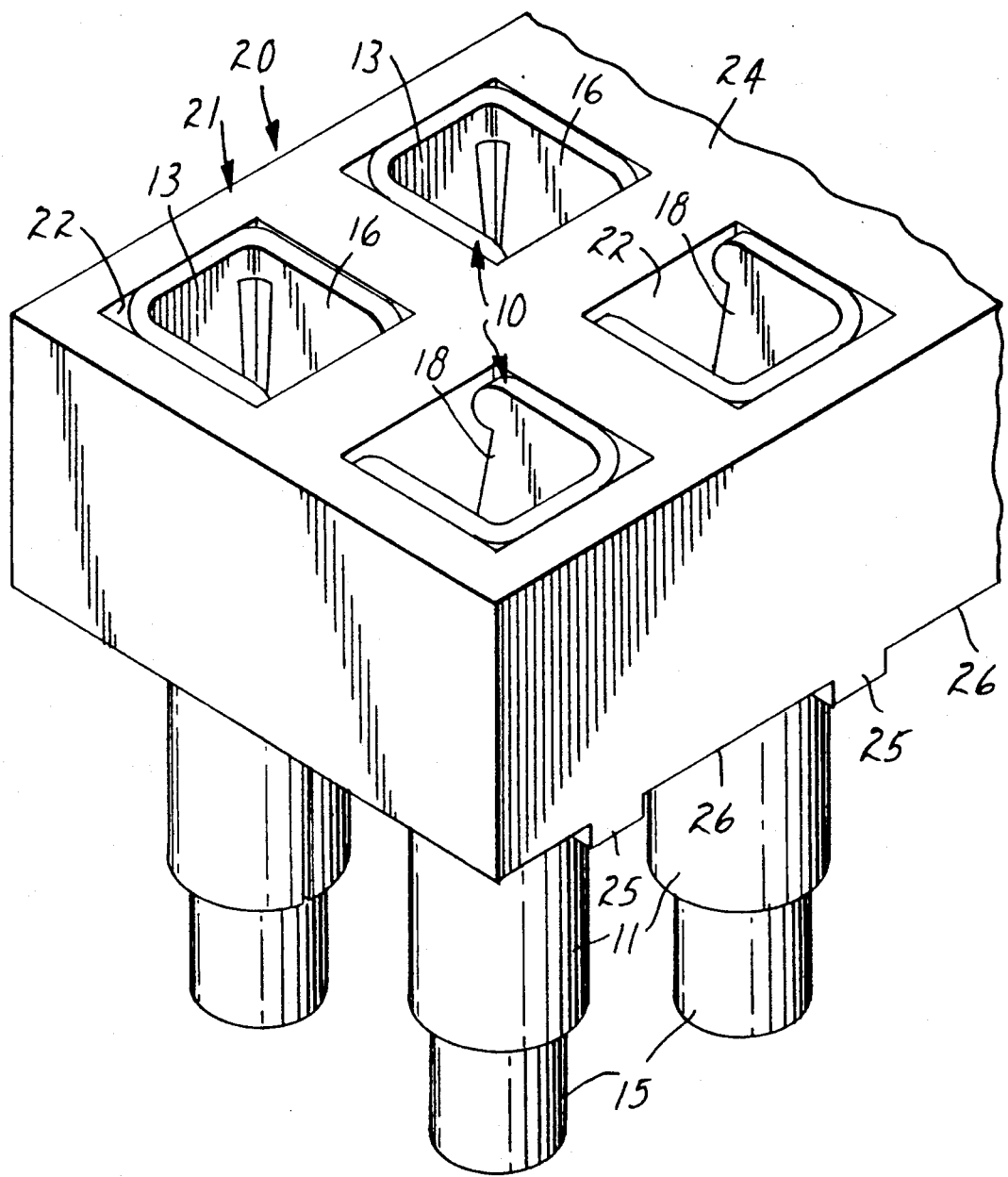
FIG. 3 is a fragmentary perspective view of a through board connector according to the present invention.

The contacts 10 are adapted to be part of a through board connector as illustrated in FIG. 3. The connector, generally identified with a reference numeral 20, comprises a body 21 formed with a plurality of openings disposed as indicated in two parallel rows. The openings 22 are generally rectangular in shape and as illustrated in FIG. 4 extend through the body 21 from one surface 24 to the other surface 26. On the surface 26 is also formed standoffs 25 which extend transversely of the body 21 and terminate at the openings 22. As shown in FIG. 3 the contacts 10 are disposed in the rectangular openings 22 with the contacting portion 12 disposed in the opening 22 with the upper end thereof generally flush with the surface 24 of the body 21 and with the contact tails 11 and the plugs 15 extending from the surface 26. The plug 15 extends beyond at least the end of the contact tail 11 disposed adjacent the soldered side of the board.

The plug is formed of a polymeric material capable of withstanding the wave solder temperatures involved without suffering failure and must also be formed with a material which will not contaminate the solder bath. An example of a suitable material is a glass filled polyphenylene sulfide. The material of the plugs 15 must withstand temperatures less than 260° C. and above −55° C.

The through board socket 20 is reduced in overall height from existing through board sockets. The overall height is reduced to 0.1 inch or less. This reduction in the height will afford new hard disk drive designs for the 2.5 inch and 3.5 inch format which are more compact than existing designs due partly to this reduction in height of the connector 20.

The connector 20 can be placed on a printed circuit board with the contact tails 11 in openings on the circuit board. It can be wave soldered to join the contact tails 11 to the holes of a printed circuit board. In a secondary process the plugs 15 are removed by being driven from the soldered barrel of the contact.

Having described the presently perferred embodiment of the invention, it will be appreciated that modifications can be made without departing from the spirit or scope of the invention as defined in the appended claims.

I claim:

1. A contact for use in a printed circuit board connector, said contact comprising:
   a contacting portion for making contact with a lead of an electronic component,
   a barrel portion of generally hollow cylindrical shape adapted to fit into an opening in a printed circuit board,
   a bridge portion connecting said contacting portion and said barrel portion, and
   a cylindrical plug removably positioned in said barrel portion to fill the barrel portion, said barrel portion surrounding said plug, and said plug being formed of a polymeric material to withstand temperatures in a range of between −55° C. and 260° C.; whereby upon removal of said plug the contacting portion can be accessed from either end of the contact by the lead of the electronic component.

2. A contact according to claim 1 wherein said contacting portion comprises a wiping contact arm.

3. A contact according to claim 1 wherein said plug extends beyond at least one end of said barrel portion.

4. A board connector comprising
   a molded body of electrically insulating material having opposite sides and a plurality of holes extending between said opposite sides, and
   a plurality of contacts, one of said contacts being disposed in each of said holes, each contact comprising
   a contacting portion for making contact with a lead of an electronic component,
   a barrel portion of generally cylindrical shape adapted to fit into an opening in a printed circuit board,
   a bridge portion connecting said contacting portion and said barrel portion to position said contacting portion within said body and between said opposite sides and to extend said barrel portion beyond one of said sides, and
   solder mask means supported within said barrel portion for protecting said barrel portion from filling with solder when a said printed circuit board is passed through a wave solder bath and removably supported therein affording removal of said solder mask means after a said wave solder operation to permit a lead of a said electronic component to enter said contacting portion form either side of said body.

5. A connector according to claim 4 wherein said body is formed with two parallel rows of said holes.

6. A connector according to claim 4 wherein said solder mask means comprises a cylindrical plug disposed in and supported by said barrel portion.

7. A connector according to claim 6 wherein said plug is formed of a polymeric material to withstand the wave solder temperature in the range of between −55° C. and 260° C. and not contaminate the solder bath.

* * * * *